United States Patent
Takeuchi et al.

(10) Patent No.: US 6,217,979 B1
(45) Date of Patent: Apr. 17, 2001

(54) PIEZOELECTRIC/ELECTROSTRICTIVE FILM ELEMENT

(75) Inventors: Yukihisa Takeuchi, Aichi-ken; Tsutomu Nanataki, Toyoake; Koji Kimura, Nagoya; Nobuo Takahashi, Owariasahi, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/085,853

(22) Filed: May 27, 1998

Related U.S. Application Data

(62) Division of application No. 08/716,876, filed on Sep. 20, 1996, now Pat. No. 5,853,514.

(30) Foreign Application Priority Data

Sep. 27, 1995 (JP) .................................................. 7-249302

(51) Int. Cl.$^7$ .............................. C04B 37/00; H01L 41/08
(52) U.S. Cl. ........................... 428/138; 428/131; 428/137; 310/324; 310/330
(58) Field of Search ...................................... 310/324, 328, 310/330, 358; 252/62.9; 428/699, 469, 701, 702, 325, 131, 137, 138

(56) References Cited

U.S. PATENT DOCUMENTS

| | | | |
|---|---|---|---|
| 4,344,904 | 8/1982 | Yamada et al. | 264/661 |
| 4,360,598 | 11/1982 | Otagiri et al. | 501/103 |
| 5,089,455 | 2/1992 | Ketcham et al. | 501/104 |
| 5,126,615 | 6/1992 | Takeuchi et al. | 310/330 |
| 5,210,455 | 5/1993 | Takeuchi et al. | 310/328 |
| 5,281,888 | * 1/1994 | Takeuchi et al. | 310/366 |
| 5,430,344 | 7/1995 | Takeuchi et al. | 310/330 |
| 5,517,076 | * 5/1996 | Takeuchi et al. | 310/358 |
| 5,545,461 | 8/1996 | Takeuchi et al. | 428/138 |
| 5,600,197 | 2/1997 | Takeuchi et al. | 310/328 |
| 5,622,748 | 4/1997 | Takeuchi et al. | 427/100 |
| 5,634,999 | 6/1997 | Takeuchi et al. | 156/89.11 |
| 5,681,410 | 10/1997 | Takeuchi et al. | . |
| 5,691,593 | * 11/1997 | Takeuchi et al. | 310/328 |
| 5,691,594 | * 11/1997 | Takeuchi et al. | 310/330 |

FOREIGN PATENT DOCUMENTS

| | | |
|---|---|---|
| 636593 | 2/1995 | (EP) . |
| 649008 | 4/1995 | (EP) . |
| 667647 | 8/1995 | (EP) . |
| 2161647 | 1/1986 | (GB) . |
| 62-213399 | 9/1987 | (JP) . |
| 3128681 | 5/1991 | (JP) . |
| 549270 | 2/1993 | (JP) . |

* cited by examiner

*Primary Examiner*—Ellis Robinson
*Assistant Examiner*—Alicia Chevalier
(74) *Attorney, Agent, or Firm*—Burr & Brown

(57) ABSTRACT

A method of producing a piezoelectric/electrostrictive film element is disclosed. The film element includes a zirconia substrate having a window which is closed by a diaphragm portion, and a piezoelectric or electrostrictive unit formed on the substrate and including a piezoelectric or electrostrictive layer between upper and lower electrodes. The method comprises the steps of: (a) preparing the substrate which has been sintered and in which at least the diaphragm portion contains alumina in an amount of 1.1–5.0 parts by weight; (b) forming, by a film-forming process, the lower electrode on the diaphragm portion, and the piezoelectric/electrostrictive layer on the lower electrode by using a piezoelectric/electrostrictive material which contains magnesia or a component which gives magnesia, in an independent form or in a compound form; and (c) firing the piezoelectric/electrostrictive layer, so as to deposit particles consisting principally of a compound of alumina and magnesia at least on an interface between the diaphragm portion and the lower electrode, the interface being located right under the piezoelectric/electrostrictive layer.

3 Claims, 2 Drawing Sheets

PIEZOELECTRIC/ELECTROSTRICTIVE FILM ELEMENT

This is a divisional application of U.S. Ser. No. 08/716,876, filed Sep. 20, 1996, now U.S. Pat. No. 5,853,514 the entirety of which is incorporated herein by reference.

BACKGROUND OF THE INVENTION

1. Field of the Invention

The present invention relates to a uni-morph, bi-morph or other types of piezoelectric and/or electrostrictive film elements which generate or detect displacement or force in the form of bending, deflection or flexure, and which can be used for actuators, filters, display devices, transformers, microphones, sounding bodies (such as loud speakers), various vibrators, resonators, or oscillators, discriminators, gyros, sensors and other components and devices. The present invention is also concerned with a method of producing such piezoelectric and/or electrostrictive film elements. The term "element" used herein means an element which is capable of transducing or converting an electric energy into a mechanical energy, i.e., mechanical displacement, strain or vibrations, or converting a mechanical energy into an electric energy.

2. Discussion of the Related Art

In recent years, in the fields of optics and precision positioning or machining operations, there has been an increasing demand for an element whose displacement is controlled for adjusting or controlling an optical path length or a position of a member or component of a device, on the order of fractions of a micron ($\mu$m), and a detecting element adapted to detect infinitesimal displacement of a subject as an electric change. To meet the demand, there have been developed piezoelectric and/or electrostrictive film elements (hereinafter referred to as "P/E film elements") used for actuators or sensors, which elements comprise a piezoelectric material such as a ferroelectric material, and utilize the reverse or converse piezoelectric effect to produce a mechanical displacement upon application of an electric field to the piezoelectric material, or utilize the piezoelectric effect to produce an electric field upon application of a pressure or mechanical stress. Among these elements, a conventional uni-morph type P/E film element has been favorably used for a loudspeaker, for example.

There have been proposed ceramic P/E film elements used for various purposes, as disclosed in JP-A-3-128681 (i.e., in the co-pending U.S. patent applications Ser. Nos. 07/550,977, 07/860,128, 08/102,960, 08/384,469, 08/392,083 and 08/452,092) and in JP-A-5-49270 (i.e., in U.S. Pat. No. 5,210,455 and U.S. patent application Ser. No. 08/013,046), which were filed by the assignee of the present invention. One example of the disclosed elements has a ceramic substrate which has at least one window, and is formed integrally with a thin diaphragm which closes the window or windows so as to provide at least one thin-walled diaphragm portion or vibratile portion. On an outer surface of each diaphragm portion of the ceramic substrate, there is formed a piezoelectric/electrostrictive unit (hereinafter referred to as "P/E unit") which is an integral laminar structure consisting of a lower electrode, a piezoelectric/electrostrictive layer (hereinafter referred to as "P/E layer") and an upper electrode. The P/E unit is formed by a suitable film-forming method or process on the corresponding diaphragm portion of the ceramic substrate. The thus formed P/E film element is relatively small-sized, inexpensive, and can be used as an electromechanical transducer having high reliability. Further, this element has a high operating response, and provides a relatively large amount of displacement by application of a low voltage, with a relatively large magnitude of force generated. Thus, the above-described element is favorably used as a member for an actuator, filter, display device, sensor or other components or devices.

To produce the P/E film element as described above, the lower electrode, P/E layer and upper electrode of each P/E unit are laminated in this order by a suitable film-forming method, on the diaphragm portion of the ceramic substrate which has been sintered. The thus formed P/E unit is subjected to heat treatment (firing or sintering) as needed, so that the P/E unit is formed integrally on the diaphragm portion. A further study of the inventors of the present invention revealed that the piezoelectric/electrostrictive characteristics of the film element is deteriorated due to the heat treatment (firing or sintering) effected during the formation of the P/E unit, more specifically, the P/E layer.

That is, the P/E layer suffers from stresses due to firing shrinkage of the P/E layer or P/E unit which is in contact with the diaphragm portion of the ceramic substrate, during the heat treatment (firing or sintering) of the P/E layer. As a result, the P/E layer may not be sufficiently sintered due to the stresses, and still suffers from stresses remaining therein after firing. In this case, the P/E film element cannot exhibit its inherent piezoelectric/electrostrictive characteristics.

In order to increase the sinterability and density of the P/E layer so as to improve the piezoelectric/electrostrictive characteristics of the film element, the firing temperature of the P/E layer may be increased, or the thickness of the diaphragm portion on which the P/E layer is formed may be reduced. However, these solutions are not yet effective to improve the sinterability of the P/E layer and to eliminate the problem of stresses remaining in the P/E layer after firing thereof. That is, the stresses remaining in the P/E layer may deteriorate the piezoelectric/electrostrictive characteristics of the film element. In particular, such residual stresses may reduce the amount of displacement of the diaphragm portion upon actuation of the P/E unit. The reduction in the thickness of the diaphragm portion makes it difficult to produce the ceramic substrate, and lowers the resonance frequency of the P/E film element.

The P/E film element suffering from such residual stresses is not capable of providing sufficient bonding strength between the diaphragm portion of the ceramic substrate and the P/E unit (the lower electrode). As a result, the P/E unit may be separated or peeled off from the diaphragm portion of the ceramic substrate during production and use of the P/E film element. Accordingly, the operating reliability of the element is undesirably deteriorated.

SUMMARY OF THE INVENTION

It is therefore a first object of the present invention to provide a method of producing a piezoelectric/electrostrictive film element wherein each piezoelectric/electrostrictive unit is formed by a film-forming method on an outer surface of a thin-walled diaphragm portion of a zirconia substrate, and wherein a piezoelectric/electrostrictive layer of each P/E unit exhibits high sinterability or density without being affected by the diaphragm portion while the bonding strength between the diaphragm portion and the P/E unit is effectively improved, so as to assure high reliability and high electromechanical conversion efficiency of the film element.

It is a second object of the invention to provide such a piezoelectric/electrostrictive film element using the method.

The above-indicated first object of the invention may be attained according to a first aspect of the invention which provides a method of producing a piezoelectric/electrostrictive film element comprising: a zirconia substrate having at least one window, and a diaphragm portion formed as an integral part of the zirconia substrate and closing each of at least one window; and a film-like piezoelectric/electrostrictive unit including a lower electrode, a piezoelectric/electrostrictive layer and an upper electrode, which are formed in the order of description on an outer surface of the diaphragm portion by a film-forming process, the method comprising the steps-of: (a) preparing the zirconia substrate which has been sintered and in which at least the diaphragm portion contains alumina in an amount of 1.1–5.0 parts by weight; (b) forming, by a film-forming process, the lower electrode on the outer surface of the diaphragm portion, and the piezoelectric/electrostrictive layer on the lower electrode by using a piezoelectric/electrostrictive material which contains magnesia or a component which gives magnesia, in an independent form or in a compound form; and (c) firing the piezoelectric/electrostrictive layer, so as to deposit particles consisting principally of a compound of alumina and magnesia at least on an interface between the diaphragm portion and the lower electrode, the interface being located right under the piezoelectric/electrostrictive layer.

According to one preferred form of the first aspect of the invention, the particles deposited at least on the interface are particles of spinel ($MgAl_2O_4$).

According to another preferred form of the first aspect of the invention, the piezoelectric/electrostrictive material includes magnesia as a component which exhibits piezoelectric/electrostrictive characteristics.

According to a further preferred form of the first aspect of the invention, the diaphragm portion of the zirconia substrate has an upwardly convex shape protruding in a direction away from the window.

In the piezoelectric/electrostrictive film element according to the present invention, the diaphragm portion of the zirconia substrate includes a predetermined amount of alumina while the piezoelectric/electrostrictive material for the piezoelectric/electrostrictive layer includes, in an independent form or in a compound form, magnesia or the component which gives magnesia. During the firing process of the piezoelectric/electrostrictive layer, magnesia or the component which gives magnesia moves toward the interface between the diaphragm portion and the lower electrode while alumina in the diaphragm portion moves toward the surface of the diaphragm portion, so that magnesia or the component which gives magnesia reacts with alumina, whereby the particles of the compound of alumina and magnesia, such as spinel, are deposited on the interface. According to this arrangement, the rigidity of the diaphragm portion is lowered or the diaphragm portion is likely to be deformed during the firing of the piezoelectric/electrostrictive layer, to thereby provide a sufficiently dense piezoelectric/electrostrictive layer. Further, the present arrangement is effective to eliminate or reduce the conventionally experienced problem of the stresses remaining in the P/E layer, assuring high operating reliability and high electromechanical conversion efficiency of the piezoelectric/electrostrictive film element. The film element obtained according to the present invention does not suffer from reduction in rigidity of the diaphragm portion after firing the P/E layer, and therefore the resonance frequency of the film element is not lowered.

The second object of the present invention may be attained according to a second aspect of the invention which provides a piezoelectric/electrostrictive film element, comprising: a zirconia substrate having at least one window, and a diaphragm portion formed as an integral part of the zirconia substrate and closing each of at least one window; a film-like piezoelectric/electrostrictive unit including a lower electrode, a piezoelectric/electrostrictive layer and an upper electrode, which are formed in the order of description on an outer surface of the diaphragm portion by a film-forming process; and the diaphragm portion and the lower electrode defining an interface right under the piezoelectric/electrostrictive layer, particles consisting principally of a compound of alumina and magnesia existing at least on the interface at an occupied area ratio of 5% or greater.

According to one preferred form of the second aspect of the invention, the compound of alumina and magnesia is spinel ($MgAl_2O_4$). The particles of the compound such as spinel existing on the interface between the diaphragm portion and the lower electrode provide an anchoring effect for bonding the diaphragm portion and the lower electrode to each other, to thereby assure enhanced bonding strength or adhesion therebetween.

DETAILED DESCRIPTION OF THE DRAWINGS

The above and optional objects, features and advantages of the present invention will be better understood by reading the following detailed description of the presently preferred embodiments of the invention, when considered in connection with the accompanying drawings, in which.

DETAILED DESCRIPTION OF THE PREFERRED EMBODIMENT

There will be hereinafter described one embodiment of a piezoelectric/electrostrictive film element according to the present invention, wherein a piezoelectric/electrostrictive unit is formed by a film-forming method on an outer surface of a diaphragm portion which closes a window formed in a zirconia substrate, and wherein particles consisting principally or essentially of a compound of alumina and magnesia are deposited on the interface between the diaphragm portion and the lower electrode, which interface is located right under the piezoelectric/electrostrictive layer. In this substrate, the zirconia substrate has one window.

Figure 1:
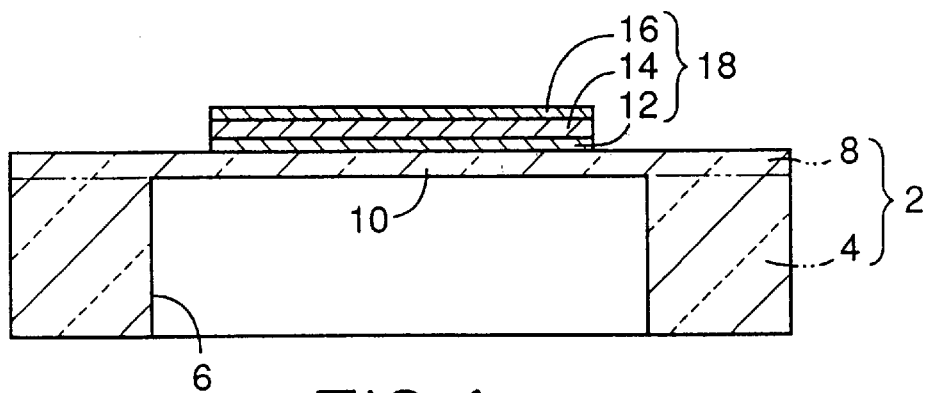
FIG. 1 is a cross sectional view showing one example of a basic structure of a piezoelectric/electrostrictive film element according to the present invention.

Referring to FIG. 1 showing one example of a piezoelectric/electrostrictive film element (hereinafter referred to as "P/E film element) according to the present invention, a zirconia substrate 2 has an integral structure which consists of a base plate 4 having a predetermined thickness, the base plate having a rectangular window 6 of a suitable size, and a relatively thin diaphragm plate 8 which closes the window 6. The diaphragm plate 8 is superposed on one of the opposite major surfaces of the base plate 4 which serves as a support member. The diaphragm plate 8 has a diaphragm portion 10 which corresponds to the window 6 of the base plate 4. On the outer surface of the diaphragm portion 10 of the planar zirconia substrate 2, a lower electrode film 12, a piezoelectric/electrostrictive layer 14 (hereinafter referred to as P/E layer), and an upper electrode 16 are laminated in this order by a known film-forming method, so as to provide a film-like piezoelectric/ electrostrictive unit 18 (hereinafter referred to as P/E unit). As known in the art, a suitable voltage is applied to the lower and upper electrodes 12, 16 through the respective lead portions not shown.

Where the P/E film element constructed as described above is used as an actuator, a voltage is applied between the two electrodes 12, 16 of the P/E unit 18 in a known manner, so that the P/E layer 14 is exposed to an electric field, and undergoes a mechanical distortion induced by the electric field. Consequently, the P/E unit 18 causes a flexing, bending, or deflecting displacement or force due to a transverse effect of the distortion of the P/E layer 14, such that the displacement or force acts on the zirconia substrate 2 (diaphragm portion 10) in a direction perpendicular to the plane or major surfaces of the zirconia substrate 2.

In producing the P/E film element according to the present invention, a sintered zirconia substrate 2 is prepared which includes 1.1–5.0% by weight of alumina at least in the diaphragm portion 10. After the lower electrode 12 is formed on the outer surface of the diaphragm portion 10 of the thus prepared zirconia substrate 2, the P/E layer 14 is formed on the lower electrode 12 by using a piezoelectric/ electrostrictive material which contains magnesia or a component which gives magnesia, in an independent form or in a compound form. The thus formed P/E layer 14 is fired, whereby particles consisting principally of a compound of alumina and magnesia, such as spinel ($MgAl_2O_4$), are deposited at least on the interface between the diaphragm portion 10 of the zirconia substrate 2 and the lower electrode 12 of the P/E unit 18, which interface is located right under the P/E layer 14. According to this arrangement, the rigidity of the diaphragm portion 10 is lowered during the heat treatment (firing) of the P/E layer 14, and the diaphragm portion 10 is likely to be deformed. Thus, this arrangement is effective to sufficiently improve the sinterability of the P/E layer 14 and to avoid the problem of the residual stresses due to the firing shrinkage of the P/E layer 14.

In the P/E film element according to the present invention, the zirconia substrate 2 which carries the P/E unit 18 thereon is favorably made of a known stabilized zirconia material or a known partially stabilized zirconia material. Particularly favorably used is a material as disclosed in JP-A-5-270912 (i.e., in U.S. Pat. No. 5,430,344 and U.S. patent application Ser. No. 08/444,930), which material contains as a major component zirconia which is partially stabilized by adding a compound(s) such as yttria, and which has a crystal phase that consists essentially of a tetragonal phase or mixture of at least two kinds of cubic, tetragonal and monoclinic phases. The crystal grain size of the zirconia substrate 2 is preferably controlled to be not greater than 1 $\mu$m. The zirconia substrate 2 made of the above-described material exhibits high mechanical strength and high toughness even with a small thickness, and is less likely to chemically react with the piezoelectric/electrostrictive material.

In producing the P/E film element according to the present invention, there is initially prepared the zirconia substrate 2 formed of the above-described zirconia material, wherein 1.1–5.0% by weight of alumina is included at least in the diaphragm portion 10. The alumina may be included in other portions of the zirconia substrate 2 such as the base plate 4, in addition to the diaphragm portion 10. If the amount of alumina is excessively large, the diaphragm portion 10 of the zirconia substrate 2 may undesirably suffer from cracking or other defects. In view of this, it is desirable that the amount of alumina be generally not more than 5.0% by weight, preferably not more than 2.5% by weight. On the other hand, an excessively small amount of alumina makes it difficult to achieve satisfactory effects according to the present invention. Thus, it is required that the amount of alumina is controlled to be at least not smaller than 1.1% by weight.

The zirconia substrate 2 wherein at least the diaphragm portion 10 contains a predetermined amount of alumina is obtained by preparing, according to a known manner, a green body of the zirconia substrate 2 in which the predetermined amount of alumina is contained at least in a portion of the green body which gives the diaphragm portion (10), and firing the green body. Described more specifically, the zirconia substrate 2 is preferably produced by 1) preparing a zirconia green sheet which gives the base plate 4 and which is formed with an aperture (window 6) by use of a metal mold or by ultrasonic machining or mechanical machining, 2) superposing, on the zirconia green sheet for the base plate 4, a thin zirconia green sheet which gives the diaphragm plate 8 (diaphragm portion 10) and which contains the predetermined amount of alumina, and bonding the green sheets together by thermo compression, and 3) firing the green sheets into an integral structure. The zirconia substrate 2 thus obtained exhibits high reliability. To assure a sufficiently high operating response speed and large displacement of the P/E film element, the thickness of the diaphragm portion 10 of the zirconia substrate 2 which carries the P/E unit 18 thereon is generally 50 $\mu$m or smaller, preferably in a range of 1 $\mu$m–30 $\mu$m, more preferably in a range of 3 $\mu$m–15 $\mu$m.

Each of the green sheets for the base plate 4 and diaphragm plate 8 formed of the suitable zirconia material may consist of a plurality of thin sheets which are superposed on each other. The diaphragm portion 10 of the zirconia substrate 2 may have a convex shape which protrudes outwards, in a direction away form the window 6, or a concave shape which protrudes inwards, toward the bottom of the window 6, in addition to the flat shape as shown in FIG. 1. However, satisfactory effects of the present invention can be attained by employing the zirconia substrate 2 whose diaphragm portion 10 has the outwardly convex shape (which protrudes upwardly as seen in FIG. 1). While the window 6 of the zirconia substrate 2, in other words, the diaphragm portion 10 has a rectangular shape in the present embodiment, the shape of the window 6 may be suitably selected from other shapes, such as a circular, polygonal an elliptical shape, and combinations of these shapes, depending upon the application or utility of the P/E film element. Similarly, the number and position of the window 6 may be suitably determined.

Next, the P/E unit 18 is formed on the diaphragm portion 10 of the sintered zirconia substrate 2 prepared as described above. Initially, on the outer surface of the diaphragm portion 10, the lower electrode 12 is formed of a suitable electrode material by a known film-forming method. The electrode material for the lower electrode 12 of the P/E unit 18 is not particularly limited, provided that the electrode material is an electrically conductive material which can withstand oxidizing atmospheres having a considerably high temperature. For example, the lower electrode 12 may be formed of a single metal, an alloy of metals, a mixture of a single metal or an alloy and an electrically insulating ceramic such as bismuth oxide, zinc oxide or titanium oxide, or an electrically conductive ceramic. However, the electrode material preferably has a major component consisting of a noble metal having a high melting point, such as platinum, palladium or rhodium, or an alloy, such as silver-palladium alloy, silver-platinum alloy or platinum-palladium alloy. The lower electrode 12 may also be formed of cermet of platinum, zirconia material for the substrate 2 and/or the piezoelectric/electrostrictive material for the P/E layer 14. More preferably, the lower electrode 12 is made solely of platinum, or include as a major component an alloy containing platinum. Where the above-described cermets are used, the content of the zirconia substrate material is preferably held in a range of 5–30% by volume, while the content of the piezoelectric/electrostrictive material is held in a range of 5–20% by volume.

The lower electrode 12 is formed, using the above-described conductive material, by suitably selected one of known film-forming methods which include thick-film forming methods, such as screen printing, spraying, coating and dipping, and thin-film forming methods, such as sputtering, ion-beam method, vacuum vapor deposition, ion plating, CVD and plating. In particular, the thick-film forming methods are favorably employed for forming the lower electrode 12. The lower electrode 12 formed by a suitably selected thick-film forming method is subjected to the conventional heat treatment (firing) for sintering of the lower electrode 12, and for integration with the diaphragm portion 10 of the zirconia substrate 2. The thickness of the lower electrode 12 is generally not greater than 20 $\mu$m, preferably not greater than 5 $\mu$m.

On the thus formed lower electrode 12, the P/E layer 14 is formed using a predetermined piezoelectric/electrostrictive material, by suitably selected one of the known film-forming methods. The P/E layer 14 may be preferably formed by one of the above-described thick-film forming methods, such as screen printing, spraying, coating and dipping. The thick-film forming method utilizes a paste or slurry which contains as a major component piezoelectric/electrostrictive ceramic particles having an average particle size of about 0.01 $\mu$m to 7 $\mu$m, preferably 0.05 $\mu$m to 5 $\mu$m, so as to form the film-like P/E layer 14 on the outer surface of the diaphragm portion 10 of the zirconia substrate 2. In this case, the resultant film element exhibits excellent piezoelectric/electrostrictive characteristics. Among the above-described thick-film forming methods, screen printing is particularly favorably employed since it permits fine patterning at a relatively low cost. The thickness of the P/E layer 14 is preferably 50 $\mu$m or smaller, more preferably in a range of 3 $\mu$m to 40 $\mu$m, to provide a relatively large displacement of the P/E layer 14 with a relatively low voltage.

The piezoelectric/electrostrictive material for forming the P/E layer 14 contains magnesia or a component which gives magnesia, in an independent form or in a compound form. The term "a component which gives magnesia" used herein means a component which provides magnesia after the firing of the P/E layer, such as magnesium per se. The piezoelectric/ electrostrictive material containing magnesia or the component which gives magnesia includes as a major component lead zirconate titanate (PZT), lead nickel niobate (PNN), lead manganese niobate, lead antimony stannate, lead zinc niobate, lead titanate or lead nickel tantalate. Alternatively, the piezoelectric/electrostrictive material includes a mixture of these materials to which magnesia or magnesium is added. In other words, the piezoelectric/electrostrictive material includes magnesia or magnesium independently of the piezoelectric/electrostrictive composition. Preferably used in the present invention is the piezoelectric/electrostrictive material which contains magnesia in a compound form within the piezoelectric/electrostrictive composition which exhibits the piezoelectric/electrostrictive characteristics. For instance, the piezoelectric/electrostrictive material preferably contains as a major component lead magnesium niobate (PMN) or lead magnesium tantalate. Alternatively, the piezoelectric/electrostrictive material preferably includes a mixture of these materials and the PZT as described above.

Among the piezoelectric/electrostrictive materials as indicated above, it is recommended to use a material which includes as a major component one of the following mixtures: a mixture of lead magnesium niobate, lead zirconate and lead titanate; a mixture of lead nickel niobate, lead magnesium niobate, lead zirconate and lead titanate; a mixture of lead magnesium niobate, lead nickel tantalate, lead zirconate and lead titanate; and a mixture of lead magnesium tantalate, lead magnesium niobate, lead zirconate and lead titanate. Further, a material containing an oxide or other compound of lanthanum, barium, niobium, magnesium, zinc, cerium, cadmium, chromium, cobalt, antimony, iron, yttrium, tantalum, tungsten, nickel, manganese, lithium, strontium, or bismuth may be added to the above-indicated piezoelectric/electrostrictive material.

When the piezoelectric/electrostrictive material having three or more components is used, the piezoelectric/electrostrictive characteristics may vary depending upon the composition of the components of the material. However, a three-component material composed of lead magnesium niobate, lead zirconate and lead titanate, a four-component material composed of lead magnesium niobate, lead nickel tantalate, lead zirconate and lead titanate, or a four-component material composed of lead magnesium tantalate, lead magnesium niobate, lead zirconate and lead titanate preferably has a composition in the vicinity of phase boundaries of a pseudo-cubic crystal phase, a tetragonal crystal phase and a rhombohedral crystal phase. To assure sufficiently high piezoelectric constant and electromechanical coupling factor, it is particularly desirable to employ one of the following compositions, that is, 1) a composition containing 15–50 mol % of lead magnesium niobate, 10–45 mol % of lead zirconate and 30–45 mol % of lead titanate, 2) 15–50 mol % of lead magnesium niobate, 10–40 mol % of lead nickel tantalate, 10–45 mol % of lead zirconate and 30–45 mol % of lead titanate and 3) 15–50 mol % of lead magnesium niobate, 10–40 mol % of lead magnesium tantalate, 10–45 mol % of lead zirconate and 30–45 mol % of lead titanate.

When the piezoelectric/electrostrictive material includes magnesia or the magnesia-giving component in a compound form as one constituent element of the piezoelectric/electrostrictive composition, it is not required to adjust the content of magnesia or the magnesia-giving component in the piezoelectric/electrostrictive material. That is, magnesia or the magnesia-giving component is employed in an amount contained in the piezoelectric/electrostrictive composition of the piezoelectric/electrostrictive material. When the piezoelectric/electrostrictive material includes magnesia or the magnesia-giving component in an independent form, the content of magnesia or the magnesia-giving component included in the piezoelectric/electrostrictive material is suitably determined depending upon the content of alumina (1.1–5.0% parts by weight) which is included in the diaphragm portion, such that magnesia or the magnesia-giving component reacts with alumina in the diaphragm portion 10 so as to produce the compound of alumina and magnesia, without adversely influencing the piezoelectric/electrostrictive characteristics of the P/E layer 14.

The P/E layer 14 thus formed on the lower electrode 12 is subjected to a suitable heat treatment (firing) for integration with the lower electrode 12 and the zirconia substrate 2, i.e., the diaphragm portion 10. The temperature of the heat treatment (firing) of the P/E layer 14 for integration with the lower electrode 12 and the diaphragm portion 10 is generally controlled to be in a range of 500° C. to 1400° C., preferably 1000° C. to 1400° C. To avoid changes in the composition of the piezoelectric/electrostrictive material of the P/E layer 14 at a high temperature, it is desirable to heat-treat or fire the P/E layer 14 while controlling the firing atmosphere to include the evaporation source of the piezoelectric/ electrostrictive material. It is also recommended to fire the P/E layer 14 while it is covered with a suitable covering member so that the surface of the P/E layer 14 is not directly exposed to the firing atmosphere. The covering member may be formed of a material similar to that of the zirconia substrate 2.

The P/E layer 14 is sintered into a dense body due to the heat-treatment (firing) as described above, to thereby exhibit the desired piezoelectric/electrostrictive characteristics. As a result of the heat-treatment (firing) of the P/E layer 14, magnesia or the component which gives magnesia present in the P/E layer 14 moves toward the diaphragm portion 10 of the zirconia substrate 2 through the lower electrode 12, while at the same time, alumina present at least in the diaphragm portion 10 of the zirconia substrate 2 moves toward the upper surface of the diaphragm portion 10 on the side of the lower electrode 12, whereby the alumina component and the magnesia component react with each other at least on the interface between the lower electrode 12 and the diaphragm portion 10 located right under the P/E layer 14, so that the two components are deposited on the interface in the form of particles of a predetermined compound.

The above-described behavior of the alumina component in the diaphragm portion 10 during the heat-treatment of the P/E layer 14 results in reduction in the rigidity of the diaphragm portion 10 of the zirconia substrate 2, and the diaphragm portion 10 tends to be easily deformed during the heat-treatment. This arrangement is effective to avoid occurrence of the stresses which would be generated due to the firing shrinkage of the P/E layer 14, so that the P/E layer 14 effectively exhibits sufficiently high sinterbility or density. Since the P/E layer 14 does not suffer from the stresses remaining therein after the firing, the P/E layer 14 is capable of exhibiting its inherent characteristics, to thereby provide the P/E film element having high reliability and high electromechanical conversion efficiency. The alumina component existing in the diaphragm portion 10 of the zirconia substrate 2 moves toward the upper surface of the diaphragm portion 10 (as seen in FIG. 1), and react with the magnesia component which moves toward the diaphragm portion 10 from the P/E layer 14 through the lower electrode 12, so as to form the compound on the interface between the lower electrode 12 of the P/E unit 18 and the diaphragm portion 10, which interface is located right under the P/E layer 14. According to this arrangement, the alumina component does not substantially exist within the diaphragm portion 10. Even in this case, however, since the rigidity of the diaphragm portion 10 is not substantially lowered after the heat-treatment of the P/E layer 14, the mechanical strength and the resonance frequency of the film element do not reduce.

In the present invention, the zirconia substrate 2 whose diaphragm portion 10 has the outwardly convex shape is preferably employed as described above. The outwardly convex shape of the diaphragm portion 10 is generally changed into an inwardly concave shape, protruding into the bottom of the window 6, after the heat-treatment of the P/E layer 14.

On the thus fired P/E layer 14, the upper electrode 16 of the P/E unit 18 is formed in the same manner as the lower electrode 12 by suitably selected one of the known film-forming methods. The upper electrode 12 may be preferably formed by screen printing which utilizes a resinate printing paste or a thick-film printing paste, or a thin-film forming method such as sputtering, ion-beam method, vapor deposition, ion plating, CVD and plating. The thickness of the upper electrode 16 is generally not greater than 20 $\mu$m, preferably not greater than 5 $\mu$m. The total thickness of the P/E unit 18 which is the sum of the thickness of the upper and lower electrodes 12, 16 and the P/E layer 14 is generally not greater than 100 $\mu$m, preferably not greater than 50 $\mu$m.

In the P/E film element produced as described above, the particles consisting principally of the compound of alumina and magnesium such as spinel ($MgAl_2O_4$), are deposited at least on the interface between the diaphragm portion 10 of the zirconia substrate 2 and the lower electrode 12 of the P/E unit 18, which interface is located right under the P/E layer 14. The particles exist on the interface at an occupied area ratio of at least 5% or greater.

Figure 2:
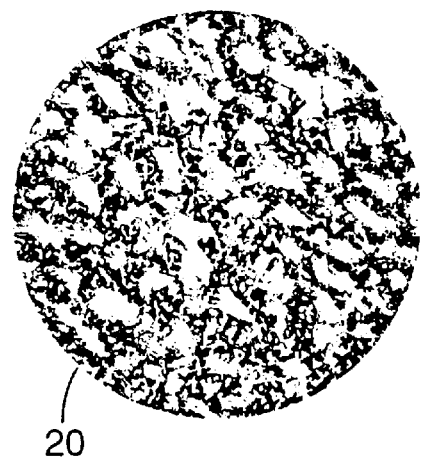
FIG. 2 is a view observed by an electron microscope, showing a surface of the diaphragm portion with the piezoelectric/electrostrictive unit being removed.

Referring to FIG. 2, there is shown a view of an exposed surface of the diaphragm portion 10 of the P/E film element formed as described above, which view is observed by an electron microscope. Described in detail, the P/E unit 18 was peeled off and removed from the zirconia substrate 2, and the outer surface of the diaphragm portion 10 located just under the P/E layer 14 was exposed. As indicated by a black pattern in the view of FIG. 2, the deposited particles 20 consisting principally of the compound produced by the reaction of alumina and magnesium are uniformly, finely, distributed on the exposed surface of the diaphragm portion 10. The deposited particles 20 exist on the abutting surfaces of the diaphragm portion 10 and the lower electrode 12, and provide an effect of anchoring the lower electrode 12 and the diaphragm portion 10 to each other, to thereby effectively enhance the adhesion or bonding strength therebetween.

The occupied area ratio of the particles 20 of the alumina-magnesia compound existing on the surface of the diaphragm portion 10 is measured in the following manner. Initially, the P/E unit 18 (consisting of the lower electrode 12, P/E layer 14 and upper electrode 16) is peeled off and removed from the zirconia substrate 2 by the following method, for instance. There is first prepared aqua regia consisting of a mixture which contains commercially available concentrated hydrochloric acid and concentrated nitric acid in a volume ratio of 3:1. The P/E film element is put into the thus prepared aqua regia which is kept at a temperature of 80° C. The P/E unit 18 is dissolved or decomposed in the aqua regia, so that the P/E unit 18 is removed from the zirconia substrate 2. The removal of the P/E unit 18 is easily effected by boiling the aqua resia. Next, the exposed surface of the diaphragm portion 10 of the zirconia substrate 2 with the P/E unit 18 being removed is observed by the electron microscope for obtaining a total area of the particles 20 of the alumina-magnesia compound existing on the exposed surface of the diaphragm portion 10, which exposed surface corresponds to the surface area of the P/E layer 14 under which the lower electrode 12 was formed. On the basis of the obtained value, the occupied area ratio of the particles 20 is calculated according to the following formula:

Occupied area ratio (%)=$(A/A_0) \times 100$, wherein $A_0$: the surface area of the diaphragm portion 10 which corresponds to that of the P/E layer 14 under which the lower electrode 12 was formed; and A: total area of the particles 20 of the alumina-magnesia compound which exist on the surface area of the diaphragm portion 10 with the P/E unit 18 being removed, which surface area corresponds to that of the lower electrode 12 right under the P/E layer 14.

The occupied area ratio of the particles 20 consisting principally of the alumina-magnesia compound is controlled to be 5% or greater, preferably 10% or greater, more preferably 30% or greater, since the existence of the particles 20 does not provide sufficient effect if the occupied area ratio is smaller than the lower limit of 5%. Although the upper limit of the occupied area ratio of the particles 20 is not particularly limited, it is desirable to control the ratio to be about 80% or smaller so as to avoid occurrence of cracking and other defects.

The thus obtained P/E film element according to the present invention does not suffer from reduction in the rigidity of the diaphragm portion, and therefore it is free from reduction in the resonance frequency. Further, the P/E layer of the P/E unit has increased density, whereby the present P/E film element exhibits excellent piezoelectric/electrostrictive characteristics with high reliability. While the P/E film element according to the present invention is advantageously used for various applications such as transducers, sensors and actuators, the present film element is advantageously used as a piezoelectric/electrostrictive actuator since the element effectively undergoes displacement and produces force upon actuation of the P/E unit formed on the outer surface of the diaphragm portion. For example, the P/E film element of the present invention is used as a filter, various sensors such as an ultrasonic sensor, an angular velocity sensor, an acceleration sensor and a shock sensor, transformers, microphones, sounding bodies such as a loud speaker, discriminators and various vibrators, oscillators and resonators for power devices and communication devices. Further, the present film element may be particularly advantageously used as a uni-morph, bi-morph or other type of piezoelectric/electrostrictive actuators which produce displacement in the form of bending or deflection, and are used for servo-displacement elements, pulse-driven motors, ultrasonic motors, piezoelectric fans and others, which elements and motors are described in "FUNDAMENTALS TO APPLICATIONS OF PIEZOELECTRIC/ELECTROSTRICTIVE ACTUATORS", Kenji Uchino, Japan Industrial Technology Center, published by Morikita-shuppan. Further, the present film element is preferably used as a thick-film condenser element and a display device.

Figure 3:
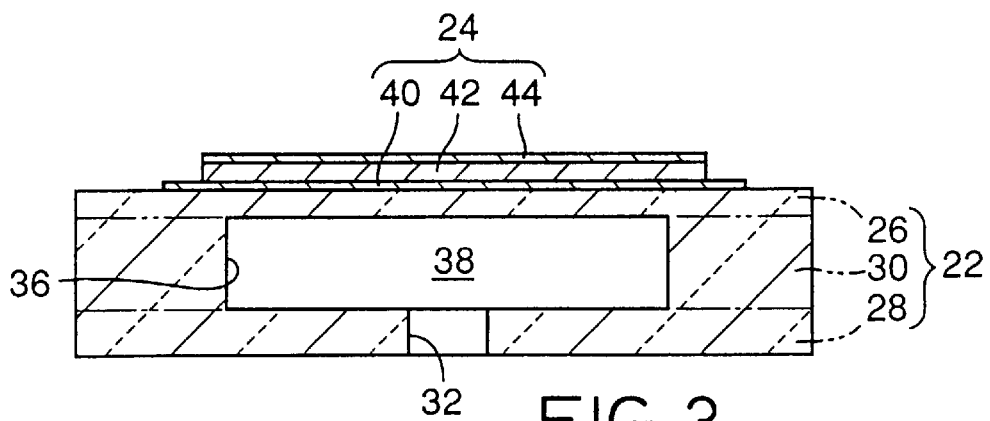
FIG. 3 is a cross sectional view showing another example of the piezoelectric/electrostrictive film element according to the invention.

Referring next to FIG. 3 schematically showing another example of a piezoelectric/electrostrictive film element (hereinafter referred to as "P/E film element") according to the present invention, and to FIG. 4 which is an exploded perspective view of the film element of FIG. 3, the film element has an integral structure which includes a zirconia substrate 22 and a plurality of piezoelectric/electrostrictive units 24 (hereinafter referred to as "P/E units") formed on relevant outer surfaces of thin-walled diaphragm or vibratile portions of the zirconia substrate 22. In operation, each of the diaphragm portions of the zirconia substrate 22 is flexed, bent or otherwise deformed upon application of a voltage to the corresponding P/E unit 24.

More specifically described, the zirconia substrate 22 has an integral laminar structure which consists of a relatively thin closure plate (diaphragm plate) 26, a connecting plate (base plate) 28 and a spacer plate (base plate) 30 which is interposed between the closure and connecting plates 26, 28. These plates 26, 28, 30 are formed of a zirconia material.

The connecting plate 28 has three communication holes 32 which are formed through the thickness of the connecting plate 28 with a suitable spacing therebetween. The number, shape, dimensions, position and other parameters of the communication holes 32 may be suitably determined depending upon a specific application or use of the P/E film element. The spacer plate 30 is formed with a plurality of square windows 36 (three in this embodiment). The spacer plate 30 is superposed on the connecting plate 28 such that the communication holes 32 of the connecting plate 28 communicate with the respective windows 36. The closure plate 26 is superposed on one major surface of the spacer plate 30 remote from the connecting plate 28, so as to close the openings of the windows 36 of the spacer plate 30. With the closure plate 26, spacer plate 30 and connecting plate 28 thus superposed on one another, three pressure chambers 38 are formed within the zirconia substrate 22, such that the pressure chambers 38 communicate with an exterior space through the corresponding communication holes 32.

The zirconia substrate 22 is an integral fired body formed of a suitable zirconia material. While the zirconia substrate 22 of the present embodiment is a three-layer structure consisting of the closure plate 26 (diaphragm plate), spacer plate 30 (base plate) and connecting plate 28 (base plate), the substrate may be formed as a four-layer or other multi-layer integral structure having four or more layers or plates.

Film-like P/E units 24 are formed on the outer surface of the closure plate 26, such that the P/E units 24 are aligned with the respective pressure chambers 38 as viewed in a plane parallel to the closure plate 26. Each of the P/E units 24 includes a lower electrode 40, a piezoelectric/electrostrictive layer 42 (hereinafter referred to as "P/E layer 42) and an upper electrode 44 which are successively formed by a suitable film-forming method on a portion of the closure plate 26 which is located in alignment with one of the windows 36 of the zirconia substrate 22, that is, on the outer surface of one diaphragm portion of the substrate 22. In operation, the pressure in the pressure chamber 38 is increased upon actuation of the corresponding P/E unit 24, so that a fluid contained in the pressure chamber 38 is effectively discharged through the corresponding communication hole 32. The P/E film element thus constructed may be used not only as an actuator, but also as a sensor or the like which is adapted to generate a voltage signal that represents flexural displacement of the diaphragm portion of the zirconia substrate 22.

In the P/E film element constructed as described above, the particles consisting principally of the compound of alumina and magnesia, such as spinel, are deposited at least on the interface between the lower electrode (40) and the diaphragm portion (26), which interface is located just under the P/E layer 42. The particles exist on the interface in the occupied area ratio of 5% or greater. The particles of the alumina-magnesia compound such as spinel may exist within the P/E layer 42 interposed by and between the upper and lower electrodes 44, 40, provided the amount of the particles is relatively small. However, the particles present in the P/E layer 42 are not desirable since such particles may adversely influence the piezoelectric/electrostrictive characteristics of the film element.

While the P/E film element according to the present invention may be used as actuators, sensors and transducers, particularly advantageously as a member of loudspeakers, display devices, servo-displacement elements, pulse-driven motors, ultrasonic motors, acceleration sensors, shock sensors, vibrators, oscillators and resonators, it is to be understood that the present film element has other applications known in the art.

EXAMPLES

To further clarify the present invention, some examples of the P/E film element of the invention will be described. However, it is to be understood that the invention is not limited to the details of the following examples, but may be embodied with various changes, modifications and improvements which will occur to those skilled in the art, without departing from the principle and scope of the present invention defined in the attached claims.

Example 1

Figure 4:
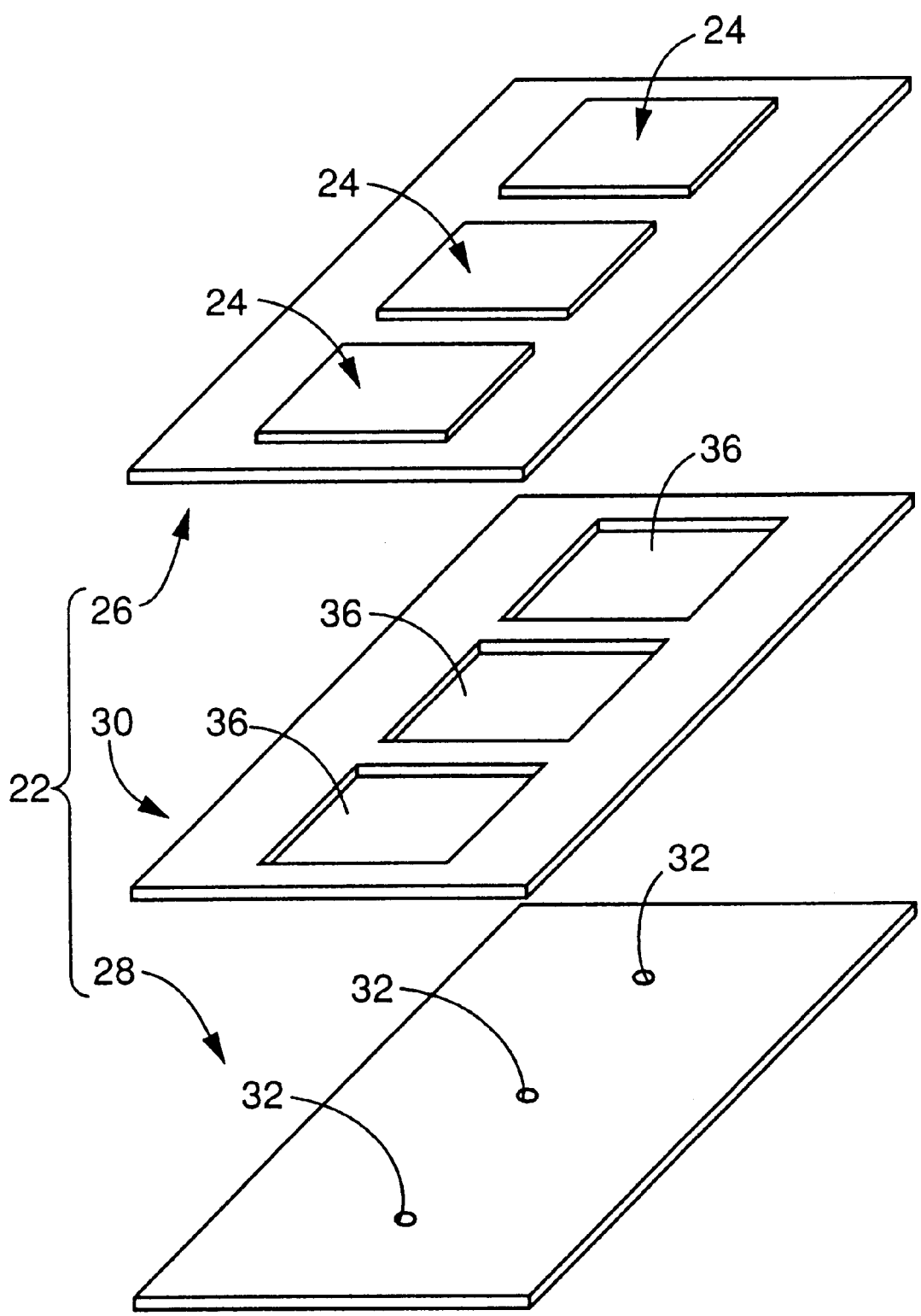
FIG. 4 is an exploded perspective view of the piezoelectric/electrostrictive film element of FIG. 3.

As examples of the P/E film element as shown in FIGS. 3 and 4, eight samples of the P/E film element were prepared by using sintered zirconia substrates 22 each having four rectangular windows 36 each of which had a width of 0.3 mm and a length of 0.5 mm. The four windows 36 are arranged in a straight row in the longitudinal direction of the zirconia substrate 22, such that the 0.3 mm-long short sides of the windows 36 are parallel to the longitudinal direction of the substrate 22 and such that the adjacent windows are spaced from each other by a spacing distance of 0.2 mm. The zirconia substrates 22 of the eight samples of the P/E film element included alumina in respective different amounts as indicated in TABLE 1. On the outer surface of each of the diaphragm portions (26) of each of the thus prepared zirconia substrates 22, the lower electrode 40, P/E layer 42 and upper electrode 44 were successively formed in the manner which will be described. The connecting plate 28 of the zirconia substrate 22 was formed with communication holes 32 each having a diameter of 0.2 mm, such that each communication hole 32 is located at the central portion of the corresponding window 36 of the spacer plate 30.

In the P/E film element of each sample, the connecting plate 28 and spacer plate 30 (which constitute the base portion of the zirconia substrate 22) had a thickness of 150 μm, respectively, when measured after firing the substrate 22 while the diaphragm plate 26 giving the diaphragm portion had a thickness of 13 μm when measured after firing the substrate 22. The connecting plate 28, spacer plate 30 and diaphragm plate 26 were formed of zirconia which was partially stabilized by 3 mol % of yttria. To obtain the zirconia substrate 22 having an integral laminar structure of the diaphragm plate 26, connecting plate 28 and spacer plate 30, green sheets for these plates 26, 28, 30 are prepared in manners as described below, laminated, bonded under pressure and then fired.

a) Preparation of a green sheet for the diaphragm plate 26

| | |
|---|---|
| zirconia powder partially stabilized by 3 mol % of yttria (average particle size: 0.4 μm) | (100–x) parts by weight |
| alumina powder (average particle size: 0.2 μm) | x parts by weight |
| polyvinyl butyral resin (binder) | 9.0 parts by weight |
| dioctyl phthalate (plasticizer) | 4.5 parts by weight |
| dispersing agent containing sorbitan fatty acid ester | 2.0 parts by weight |
| solvent containing 50/50 of toluene and isopropyl alcohol | 70 parts by weight |

The above-indicated ingredients were blended in a pot mill with zirconia balls, to provide a slurry having the initial viscosity of 1200 cps (centipoise). The thus obtained slurry was degassed under vacuum, and its viscosity was adjusted to 2000 cps. Then, the slurry was formed by a reverse roll coater machine into a green sheet which provides after firing the diaphragm portion having a thickness of 8 μm or 13 μm. The green sheet was dried at 50° C. for ten minutes.

b) Preparation of green sheets for the connecting plate 28 and the spacer plate 30

| | |
|---|---|
| zirconia powder partially stabilized by 3 mol % of yttria (average particle size: 0.4 μm) | (100–x) parts by weight |
| alumina powder (average particle size: 0.2 μm) | x parts by weight |
| polyvinyl butyral resin (binder) | 8.0 parts by weight |
| dioctyl phthalate (plasticizer) | 4.0 parts by weight |
| dispersing agent containing sorbitan fatty acid ester | 1.0 parts by weight |
| solvent containing 50/50 of xylene/(n-) butyl alcohol | 63 parts by weight |

The above-indicated ingredients were blended in a pot mill with zirconia balls, to provide a slurry having the initial viscosity of 2000 cps. The thus obtained slurry was degassed under vacuum, and its viscosity was adjusted to 5000 cps. Then, the slurry was formed by doctor blade method into green sheets which provide after firing the connecting plate 28 and the spacer plate 30, respectively, each having a thickness of 150 μm. The green sheets were dried at 80° C. for two hours.

The thus obtained green sheets for the connecting plate 28 and the spacer plate 30 were punched according to respective patterns by means of suitable metal molds, so as to form the communication holes 32 and the windows 36, respectively. Then, the green sheet for the diaphragm plate 26 produced as described above was laminated on these green sheets, and bonded thereto by thermo-compression under the pressure of 100 kg/cm$^2$ at 80° C. for one minute. The thus obtained integral laminar structure was fired at 1500° C. for two hours. Thus, there were obtained various zirconia substrates 22 which contained respective different amounts of alumina in the diaphragm portions and the base portion thereof.

On the outer surface of each of the diaphragm portions (26) of the zirconia substrate 22 of each sample, a platinum paste was printed by screen printing, dried at 120° C. for ten minutes and fired at 1350° C. for two hours, to provide the lower electrode 40 having a thickness of 3 μm.

Subsequently, a paste for the P/E layer was printed by screen printing on the lower electrode 40, dried at 120° C. for twenty minutes and fired at 1275° C. for two hours, to provide the P/E layer 42 having a thickness of 30 μm. The paste was formed in the following manner. There was first prepared a powder of a piezoelectric/electrostrictive material which consisted of 38 mol % of lead magnesium niobate, 24 mol % of lead zirconate and 38 mol % of lead titanate, and in which a part of Pb was substituted by Sr and La. The powder had an average particle size of 0.9 μm. Then, a composition consisting of 100 parts by weight of the thus prepared powder, 3 parts by weight of acrylic binder and 20 parts by weight of terpineol (solvent) was kneaded to provide the paste for the P/E layer 42 having the viscosity of 100000 cps. The P/E layer 42 was fired in the furnace in the presence of the powder of the piezoelectric/electrostrictive material used to form the paste, so as to control the firing atmosphere in the firing furnace.

Upon completion of the firing of the P/E layer 42, a Cr thin film was formed by sputtering on the P/E layer 42, and a Cu film was formed on the Cr film to provide the upper electrode 44. Thus, samples Nos. 1–8 of the P/E film element as indicated in TABLE 1 were obtained. The obtained samples of the film element were subjected to polarization treatment by applying 40 V between the upper and lower electrodes 44, 40 of each P/E unit 42 for ten minutes in a forward direction as viewed in the direction of displacement of the P/E layer 42.

Each of the samples of the P/E film element was evaluated in terms of the displacement characteristic and the resonance frequency. Further, the P/E units 24 were removed from the zirconia substrate 22 of each sample, and the exposed surface of each diaphragm portion (26) was observed by the electron microscope. In other words, the exposed surface of each diaphragm portion corresponding to the surface area of the P/E layer 42 was observed, so as to obtain the occupied area ratio of the particles consisting principally of the compound of alumina and magnesia deposited on the interface between the lower electrode 40 and the diaphragm portion (26). The results are shown in TABLE 1. The observation by the electron microscope (capable of an elemental analysis and an x-ray diffraction analysis) revealed that the deposited particles were composed of spinel.

To evaluate the displacement characteristic of each sample of the P/E film element, a voltage of 30 V was applied between the upper and lower electrodes 44, 40 of each P/E unit 24 in the direction of the polarization treatment as explained above. The amount of displacement of each P/E unit was measured by a laser doppler device. The occupied area ratio of the deposited particles of each sample of the film element was obtained in the following manner. Each sample of the P/E film element was put into the above-described aqua regia kept at 80° C., so that the P/E units 24 of each sample were dissolved or decomposed in the aqua resia, and removed from the substrate. The surface of each diaphragm portion (26) from which the corresponding P/E unit 24 was removed was observed by the electron microscope capable of an elemental analysis. Then, the total area of the deposited particles present on the exposed surface of the diaphragm portion was obtained so as to calculate the occupied area ratio (%) according to the equation as explained above. In the following TABLE 1, the displacement characteristic of each sample is represented as an average of the amounts of displacement of the four P/E units. Similarly, the occupied area ratio of each sample is represented as an average of the occupied area ratios of the four diaphragm portions.

diaphragm portion (26) on the interface between the diaphragm portion (26) and the lower electrode 40, whereby the particles of spinel were deposited on the interface. In this case, it was confirmed that a part of the alumina component present in the connecting plate 28 and spacer plate 30 moved toward the diaphragm portion (26) and was involved in the reaction with the magnesia component. The deposited spinel particles existed on the outer surface of the diaphragm portion in relatively high occupied area ratio as indicated in TABLE 1. Accordingly, the samples Nos. 3–6 of the P/E film element according to the present invention exhibited excellent displacement characteristic as also shown in TABLE 1. It was also recognized from TABLE 1 that the resonance frequency of each of the samples Nos. 3–6 did not lower since the rigidity of each diaphragm portion did not change after the alumina component moved from the inside of the diaphragm portion (26) toward the outer surface of the diaphragm portion (26).

In contrast, in the samples Nos. 1 and 2 of the film element wherein the amount of alumina present at least in the diaphragm portion (26) of the zirconia substrate 22 was insufficient, the spinel particles were not sufficiently deposited on the interface between the diaphragm portion (26) and the lower electrode 40. Further, in the samples Nos. 7 and 8 wherein alumina was not included at least in the diaphragm portion (26) of the substrate 22, the spinel particles are not deposited at all. Thus, unlike the P/E film elements according to the present invention, the film elements according to the comparative examples did not exhibit improved displacement characteristic.

Example 2

As examples of the P/E film element as shown in FIGS. 3 and 4, five samples of the P/E film element were prepared by using sintered zirconia substrates 22 each having ten rectangular windows 36 each of which had a width of 0.5 mm and a length of 0.7 mm. The ten windows 36 are arranged in a straight row in the longitudinal direction of the zirconia substrate 22, such that the 0.5 mm-long short sides of the windows 36 are parallel to the longitudinal direction

TABLE 1

| Sample No. | Content of alumina (x parts by weight) | Thickness of the diaphragm portion ($\mu$m) | Displacement characteristic ($\mu$m) | Resonance frequency (MHz) | Occupied area ratio (%) |
| --- | --- | --- | --- | --- | --- |
| *1 | 0.2 | 13 | 0.14 | 1.0 | 2 |
| *2 | 0.8 | 13 | 0.17 | 1.0 | 4 |
| 3 | 1.1 | 13 | 0.21 | 1.0 | 12 |
| 4 | 1.5 | 13 | 0.22 | 1.0 | 30 |
| 5 | 2.5 | 13 | 0.22 | 1.0 | 80 |
| 6 | 5.0 | 13 | 0.19 | 1.0 | 95 |
| *7 | 0.0 | 13 | 0.12 | 1.0 | 0 |
| *8 | 0.0 | 8 | 0.16 | 0.7 | 0 |

*comparative examples

As is apparent from the results of TABLE 1, the samples Nos. 3–6 of the present P/E film element wherein the base portion and the diaphragm portion (26) of the zirconia substrate 22 contained alumina in an amount ranging from 1.1–5.0% by weight exhibited excellent displacement characteristic. Described more specifically, since the piezoelectric/electrostrictive material for the P/E layer 42 included magnesia in compound form, the magnesia component in the P/E layer 42 moved toward the diaphragm portion (26) of the substrate 22 during firing of the P/E layer 42, and reacted with the alumina component included in the of the substrate 22 and such that the adjacent windows are spaced from each other by a spacing distance of 0.2 mm. The diaphragm portions (26) of the zirconia substrates 22 of the five samples of the P/E film element included alumina in respective different amounts as indicated in TABLE 2. On the outer surface of each of the diaphragm portions (26) of each of the thus prepared zirconia substrates 22, the P/E unit 24 was formed in the manner which will be described.

The green sheets which give the respective plates of each zirconia substrate 22 were produced in the following manner.

a) Preparation of green sheets for the connecting plate 28 and the spacer plate 30

| | |
|---|---|
| zirconia powder partially stabilized by 3 mol % of yttria (average particle size: 0.8 μm) | 100 parts by weight |
| polyvinyl butyral resin (binder) | 10 parts by weight |
| dioctyl phthalate (plasticizer) | 5 parts by weight |
| dispersing agent containing sorbitan fatty acid ester | 2 parts by weight |
| solvent containing 50/50 of toluene and isopropyl alcohol | 73 parts by weight |

The above-indicated ingredients were blended in a pot mill with zirconia balls, to provide a slurry having the initial viscosity of 1000 cps. The thus obtained slurry was degassed under vacuum, and its viscosity was adjusted to 10000 cps. Then, the slurry was formed by doctor blade method into green sheets which provide after firing the connecting plate 28 and the spacer plate 30, respectively, each having a thickness of 150 μm. The green sheets were dried at 80° C. for three hours.

b) Preparation of a green sheet for the diaphragm plate 26

| | |
|---|---|
| zirconia powder partially stabilized by 3 mol % of yttria (average particle size: 0.8 μm) | (100-x) parts by weight |
| alumina powder (average particle size: 0.2 μm) | x parts by weight |
| polyvinyl butyral resin (binder) | 9 parts by weight |
| dibutyl phthalate (plasticizer) | 4 parts by weight |
| dispersing agent containing sorbitan fatty acid ester | 2 parts by weight |
| solvent containing 50/50 of toluene and isopropyl alcohol | 70 parts by weight |

The above-indicated ingredients were blended in a pot mill with zirconia balls, to provide a slurry having the initial viscosity of 1000 cps. The thus obtained slurry was degassed under vacuum, and its viscosity was adjusted to 3000 cps. Then, the slurry was formed by a reverse roll coater machine into a green sheet which provides after firing the diaphragm portion (26) having a thickness of 9 μm.

The green sheets for the connecting plate 28 and the spacer plate 30 prepared as described above were punched according to respective patterns by means of suitable metal molds, so as to form the communication holes 32 and the windows 36, respectively. Then, the green sheet for the diaphragm plate 26 produced as described above was laminated on these green sheets, and bonded thereto by thermocompression under the pressure of 100 kg/cm² at 80° C. for one minute. The thus obtained integral laminar structure was fired at 1500° C. for two hours. Thus, there were obtained various zirconia substrates 22 whose diaphragm portions (26) contained the respective different amounts of alumina as indicated in TABLE 2. The zirconia substrates 22 in the samples Nos. 9–12 of the P/E film element had the diaphragm portions (26) each having the outwardly convex shape (whose amount of protrusion is about 20 μm.)

On the outer surface of each of the diaphragm portions (26) of the ceramic substrate 22 of each sample, a platinum paste was printed by screen printing, dried at 120° C. for ten minutes and fired at 1350° C. for two hours, to provide the lower electrode 40 having a thickness of 5 μm.

Subsequently, the P/E layer 42 was formed on each of the thus formed lower electrode 40 of each sample as described below. Initially, a paste for the P/E layer was prepared by using a powder of a piezoelectric/electrostrictive material which consisted of 38 mol % of lead magnesium niobate, 24 mol % of lead zirconate and 38 mol % of lead titanate, and in which a part of Pb was substituted by Sr and La. This paste for the P/E layer 42 was printed by screen printing on the lower electrode 40, dried at 120° C. for twenty minutes and fired at 1275° C. for two hours, to provide the P/E layer 42 having a thickness of 30 μm. The P/E layer 42 was fired in the furnace in the presence of the powder of the piezoelectric/electrostrictive material used to form the paste, so as to control the firing atmosphere in the firing furnace.

Upon completion of the firing of the P/E layer 42, a Cr thin film was formed by sputtering on the P/E layer 42, and a Cu film was formed on the Cr film to provide the upper electrode 44. Thus, samples Nos. 9–13 of the P/E film element as indicated in TABLE 2 were obtained. The obtained samples of the film element were subjected to polarization treatment by applying 100 V between the upper and lower electrodes 44, 40 of each P/E unit 24.

Each of the thus obtained P/E film elements was evaluated in terms of the displacement characteristic, the resonance frequency and the occupied area ratio of the spinel particles deposited on the interface between the diaphragm portion (26) and the lower electrode (40), in the same manner as in the EXAMPLE 1. The results are shown in TABLE 2. In the following TABLE 2, the displacement characteristic of each sample is represented as an average of the amounts of displacement of the ten P/E units. Similarly, the occupied area ratio of each sample is represented as an average of the occupied area ratios of the ten diaphragm portions.

TABLE 2

| Sample No. | Content of alumina in the diaphragm portion (x parts by weight) | Thickness of the diaphragm portion (μm) | Displacement characteristic (μm) | Resonance frequency (MHz) | Occupied area ratio (%) |
|---|---|---|---|---|---|
| *9 | 0.8 | 9 | 0.23 | 0.6 | 3 |
| 10 | 1.1 | 9 | 0.37 | 0.6 | 10 |
| 11 | 1.5 | 9 | 0.36 | 0.6 | 25 |
| 12 | 2.5 | 9 | 0.37 | 0.6 | 65 |
| *13 | 0.0 | 9 | 0.19 | 0.6 | 0 |

*comparative examples

As is apparent from the results of TABLE 2, the samples Nos. 10–12 of the P/E film element of the present invention wherein the diaphragm portions (26) included alumina in respective suitable amounts as specified according to the present invention exhibited excellent displacement characteristic.

In the P/E film element constructed according to the present invention, the magnesia component included in the piezoelectric/electrostrictive material for the P/E layer and the alumina component included at least in the diaphragm portion of the zirconia substrate move toward at least the interface between the diaphragm portion and the lower electrode, which interface is located right under the P/E layer. The alumina component and the magnesia component react with each other at the interface, to thereby deposit the particles of the compound consisting of the two components. According to this arrangement, the rigidity of the diaphragm portion is effectively reduced during the firing of the P/E layer and the diaphragm portion is likely to be easily deformed, so that the P/E layer is effectively sintered into a sufficiently dense body. Further, the present P/E film element is free from the conventionally experienced residual stresses due to the firing shrinkage of the P/E layer, assuring high operating reliability and high electromechanical conversion efficiency.

In the present P/E film element constructed as described above, the alumina component existing in the diaphragm portion moves toward the surface of the diaphragm portion during the firing of the P/E layer, and the amount of alumina within the diaphragm portion is considerably reduced. However, the rigidity of the diaphragm portion does not substantially lower after the firing, so that the film element does not suffer from reduction in the resonance frequency.

In the P/E film element according to the present invention, the particles of the compound consisting of alumina and magnesia deposit and exist at least on the interface between the diaphragm portion and the lower electrode right under the P/E layer. The deposited particles provide anchoring effect for bonding the diaphragm portion and the lower electrode to each other, assuring enhanced bonding strength or adhesion therebetween.

What is claimed is:

1. A piezoelectric/electrostrictive film element comprising:

a ziroconia substrate having at least one window, and a diaphragm portion formed as an integral part of said ziroconia substrate and closing each of said at least one window and where said diaphragm portion contains an alumina component in an amount of 1.1–5.0 parts by weight before firing; and a piezoelectric/electrostrictive unit film including a lower electrode, a piezoelectric/electrostrictive layer and an upper electrode, which are formed in the order of description on an outer surface of said diaphragm portion by a film-forming process, said piezoelectric/electrostrictive layer being formed using a piezoelectric/electrostrictive material which contains magnesia or a component which gives magnesia in an independent form or in a compound form;

wherein said diaphragm portion and said lower electrode define an interface directly under said piezoelectric/electrostrictive layer, and particles consisting essentially of a compound of alumina and magnesia exist at least on said interface at an occupied area ratio of 10% or greater, wherein occupied area ratio is defined by $(\%)=(A/A_0)\times 100$, $A_0$ being the surface area of the diaphragm portion which corresponds to that of the piezoelectric/electrostrictive layer under which the lower electrode was formed, and A being the total area of particles consisting essentially of the alumina-magnesia compound which exist on the surface area of the diaphragm portion with the piezoelectric/electrostrictive unit being removed, which surface area corresponds to that of the lower electrode right under the layer, to thereby relax said diaphragm portion during sintering of said piezoelectric/electrostrictive layer to facilitate sintering of said piezoelectric/electrostrictive layer.

2. A piezoelectric/electrostrictive film element according to claim 1, wherein said particles exist on said interface at said occupied area ratio of 30% or greater.

3. A piezoelectric/electrostrictive film element according to claim 1, wherein said compound of alumina and magnesia is spinel.

\* \* \* \* \*